United States Patent [19]
Bhatt et al.

[11] Patent Number: 4,563,385
[45] Date of Patent: Jan. 7, 1986

[54] HYBRID GLASS CLOTH FOR PRINTED CIRCUIT BOARDS

[75] Inventors: Anilkumar C. Bhatt, Endicott, N.Y.; Donald E. Doran, New Milford, Pa.; James W. Knight, Endicott, N.Y.

[73] Assignee: International Business Machines Corporation, Armonk, N.Y.

[21] Appl. No.: 622,513

[22] Filed: Jun. 20, 1984

[51] Int. Cl.$^4$ ............................................. B32B 7/00
[52] U.S. Cl. .................................... 428/251; 428/257; 428/258; 428/273; 428/901
[58] Field of Search ............... 428/251, 257, 258, 259, 428/273, 901; 139/420 C

[56] References Cited

U.S. PATENT DOCUMENTS

| | | | |
|---|---|---|---|
| 4,066,106 | 1/1978 | Graham | 139/420 C |
| 4,414,264 | 11/1983 | Olson | 428/901 |
| 4,428,995 | 1/1984 | Yokono et al. | 428/901 |
| 4,446,191 | 5/1984 | Myadera et al. | 428/257 |

Primary Examiner—James J. Bell
Attorney, Agent, or Firm—David L. Adour; Kenneth P. Johnson

[57] ABSTRACT

Woven glass fiber cloth for printed circuit substrates in which the warp is of plied yarn and the fill is of unplied or twisted yarn to facilitate more thorough polymeric resin impregnation and achieve improved dimensional stability.

6 Claims, 4 Drawing Figures

FIGURE 3

HYBRID GLASS CLOTH FOR PRINTED CIRCUIT BOARDS

BACKGROUND OF THE INVENTION

This invention relates generally to laminates for printed circuits and more specifically to the woven glass fabric used as a reinforcing filler in such laminates.

Cloth woven of warp and fill yarns composed of fine, twisted glass filaments, also known as unplied yarns, is widely used as reinforcement and substrate filler material for printed circuits. The cloth is typically impregnated in a treater with a liquid resin of organic polymer such as epoxy, then partially polymerized or semi-cured by heat to an easily handled material known as prepreg. It is laminated with other prepreg sheets or metal foil to full polymerization or final cure under heat and pressure. The foil is etched to form circuits and multiple sets of laminate can be joined. Thereafter, holes are drilled for circuit vias from one surface of the laminate to the other to enable connections between circuit lines on the opposite panel surfaces or intermediate circuit planes in multilayer panels.

The via or through hole walls are plated with conductive material that is usually copper to provide electrical continuity. For the plating process, the newly-drilled holes are cleaned with a liquid, seeded with a plating accelerator in a bath, then metal-plated by immersion in an electroless plating solution After these circuitized substrates have been in service varying lengths of time, failures frequently have occurred as short circuits.

Analysis of these failures has revealed that metal, usually copper, has plated onto the interior of the glass yarns along the filament surfaces extending from the hole walls, eventually contacting a nearby voltage or ground plane or another hole wall. The spontaneously plated metal has resulted from plating solution being trapped in voids along the glass filaments of the warp yarn and subjected to applied voltage differentials. The solution becomes trapped in the voids from the time the hole walls were initially immersed in plating solution. After plating had been completed, the plating solution had been unable to drain from the filament voids. The voids generally were elongated and occurred near the centers of the warp yarns. This indicates that the glass yarns were not wholly or entirely impregnated with resin so that voids existed among the bunched filaments forming those yarns. Such voids occurred only infrequently within the orthogonal fill or weft yarns.

A subsequent finishing step for the cloth in the manufacturing process is that of removing filament lubricant coatings. The fabric is subjected to high temperature that has the ancillary effect of further tending to fix the cross sectional dimensions of the yarn and prevent later yarn relaxation or expansion.

The difficulty of thoroughly impregnating the unplied glass yarns has been discussed in a paper by G. Wiedemann, H. Rothe, A. Hasse and R. Wiechmann entitled "Relations Between Properties of Wetting and Impregnation, Technology, and Application of FRP", Advanced Composition of Matter, Proceedings International Conference, 3rd, Volume 2, pages 1636–51, 1980. On pages 1641 and 1642, the authors describe the presence of capillary lines or hollow spaces among filaments, particularly in the warp yarns. Their investigation concluded that the total impregnation of yarns was hindered by gumming due to the coupling agents used for adherence and to the density of the packed filaments in the yarn requiring greater displacement of air.

One of the proposed solutions to the problem of internal voids within twisted, unplied glass yarns has been to use plied yarns for both warp and fill. Plied yarns are composed of two or more twisted strands wrapped about each other in the fashion of a rope. Each strand has a plurality of glass fibers or filaments. The strands are twisted a predetermined number of times per unit length as with the usual unplied yarns and then wrapped in rope fashion. Advantageously, the wrapping is done in a direction that, in essence, untwists the pretwisted yarns so that the bundles of parallel filaments in each strand overlie each other. This in effect loosened the bundles of filaments to allow elliptical cross sections with shorter conjugate axes allowing easier resin impregnation of the cloth.

The use of plied yarns as filler and reinforcement in printed circuit substrates resulted in more thorough and satisfactory resin impregnation by the organic polymers and radically reduced the problem of yarn voids. Plied yarn substrates, however, have the inherent difficulty of dimensional instability. Although the use of plied yarns was acceptable for substrates having only a few prepreg layers in the composite circuit panel, the substitution of plied yarn prepreg brought unacceptable shifting and dimensional change as the number of prepreg layers were increased to provide a larger number of circuit layers in the ultimate, multilayer composite panel or board.

The wrapping of two or more strands results in the regular crossing of the filament bundles so that the cloth thickness is slightly greater when the regular or full number of filaments is used in each yarn. During impregnation, pressing and semi-curing at the prepreg stage, stresses are induced. Subsequent laminating and final curing under heat and pressure then caused dimensional changes of the circuit panel in which panel length or width vary irregularly. This produces an unacceptable shifting and the potential for short circuits among the layers of the ultimate product.

In an attempt to improve dimensional stability, the size of the plied yarns was decreased by reducing the number of glass filaments in each yarn. The effect of this is to reduce the crimp angle at the intersection where each yarn crosses an orthogonal yarn. As a consequence, the dimensional stability of the prepreg improves but more layers of prepreg are necessary to establish the required dielectric constant between circuit layers. Additional layers translate directly into greater expense. There are required the use of more expensive yarn since it is plied, a greater quantity of woven cloth for more layers, increased resin treatment for more cloth and longer processing times. The attainment of required dielectric constants meant increased costs.

OBJECTS AND SUMMARY OF THE INVENTION

A primary object of this invention is to provide a printed circuit substrate reinforcing material that combines both plied and unplied yarns of glass fibers to produce a woven fabric and that is capable of being reliably and thoroughly impregnated with a polymerizable resin.

A further object of this invention is to provide a printed circuit substrate reinforcing material of woven glass fibers in which the warp yarns are plied yarns and the fill yarns are unplied yarns.

Another object of this invention is to provide an improved printed circuit substrate material of resin impregnated woven glass fiber fabric that can be more reliably impregnated with a polymerizable resin, has improved dimensional stability and is less expensive to manufacture than fabric made entirely of plied yarns.

The foregoing objects are accomplished in accordance with the invention by weaving glass fiber reinforcing fabric of both the plied and the twisted, unplied yarns in which the plied yarns are the warp or longitudinal members that are subjected to the greater tensions during weaving and cleaning, and the unplied yarns are the fill yarns that receive relatively little tensile stress during processing.

This combination provides a fabric that can be more reliably impregnated by the polymeric resins. Plied yarns, although comprised of filament bundles wrapped about each other, have most of the original twist removed during plying to thereby open the yarn and make it more permeable to the impregnating resin. Unplied yarns retain their original twist but, when used as the lower stressed fill yarns, relax sufficiently so that they can be thoroughly impregnated with resin. This hybrid fabric also has improved dimensional stability over the cloth made entirely of plied yarns, and its manufacturing cost is decreased due to only half of the yarn being plied.

The foregoing and other objects, features and advantages of the invention will be apparent from the following more particular description of a preferred embodiment of the invention, as illustrated in the accompanying drawings.

DESCRIPTION OF THE PREFERRED EMBODIMENT

The present invention overcomes many of the foregoing disadvantages by using both plied and unplied or twisted yarns of glass filaments. The plied yarns are used as the warp and the unplied yarns are used as the fill to produce, in effect, a hybrid cloth. Plied yarns, being wrapped and reducing the original twist through the plying operation, have an elliptical cross section that has a short conjugate axis so that the yarn can be more easily impregnated with the polymeric resin. Resin can more readily reach the center filaments of the yarn since it has less distance to travel and less impedance.

Figure 1:
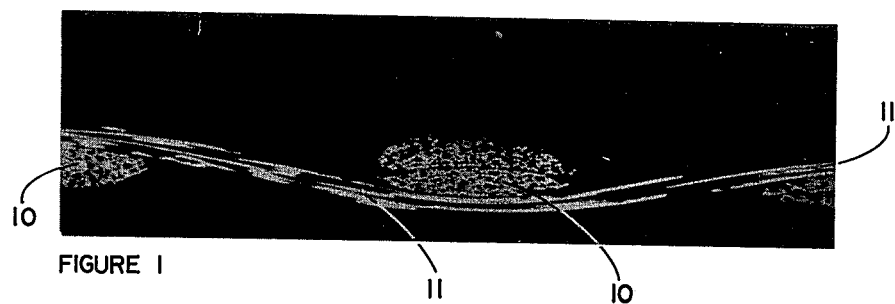
FIGS. 1 and 2 are photomicrographs of the filaments in glass fiber cloth in which the warp and fill yarns are of the plied type.
Figure 2:
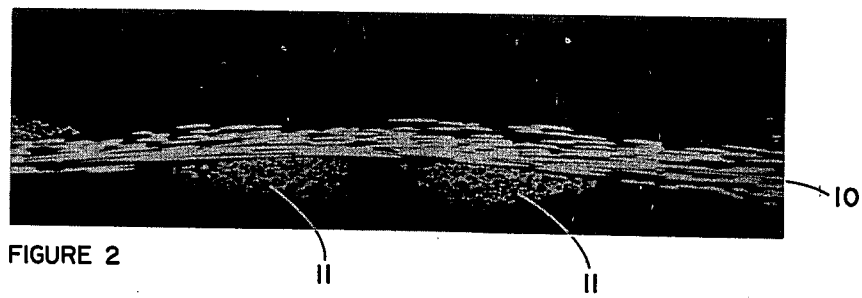
Figure 3:
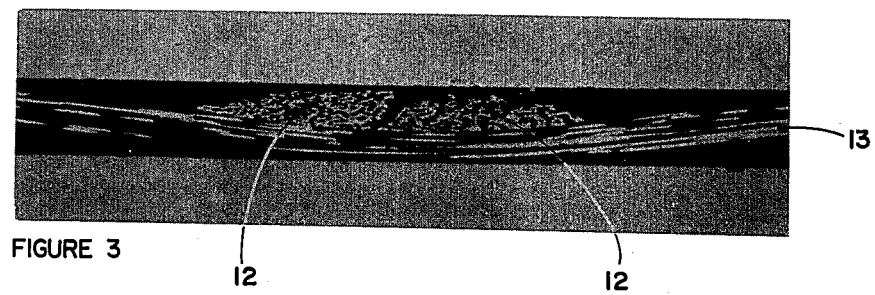
FIGS. 3 and 4 are photomicrographs of the filaments in glass fiber cloth in which the warp yarns are plied and the fill yarns are unplied in accordance with the principles of the invention.
Figure 4:
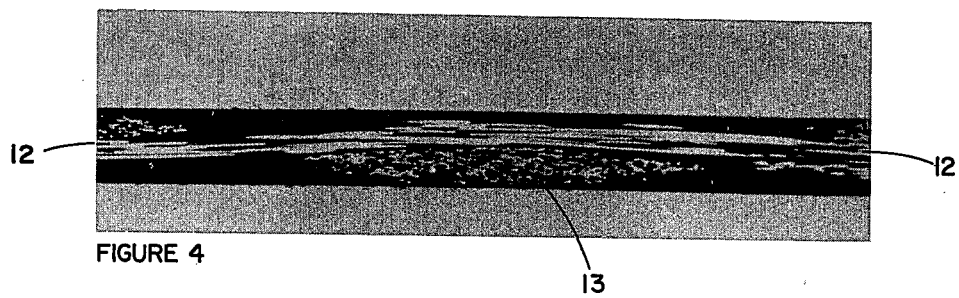

The photomicrographs of sectioned glass cloth are shown in FIGS. 1-4. FIGS. 1 and 2 illustrate warp yarns 10 and fill yarns 11, respectively, and both yarns are of the plied type. In FIGS. 3 and 4, there are shown in section plied warp yarns 12 and unplied fill yarns 13, respectively, from a hybrid cloth according to the invention. It will be noted on comparing FIGS. 1 and 3 that the sectioned warp yarns in FIG. 1 are less able to flatten thus making a relatively large dimension for the resin to permeate. Also, the crossing fill yarn 14 in FIG. 1 has more severe undulations resulting in a steeper crimp angle and less dimensional stability. It will be noted on a comparison of the sectioned fill yarns shown in FIGS. 2 and 4 that the unplied yarn of FIG. 4 is more expanded than its counterpart in FIG. 2 thus achieving an openness that permits easy resin flow amongst its filaments. It will be seen from FIGS. 2 and 4 that warp yarns 15 and 16 have shallower undulations because of the tension applied during the processing period.

Unplied yarns, when used as the fill, are not maintained in tension so that the cross section of these yarns also is elliptical and has a short conjugate axis that promotes impregnation. The relaxation of the unplied yarn in the fill allows the yarn to flatten as it crosses the orthogonal warp so that the central filaments are less deeply buried and more accessible. Voids within the interstices of the yarns in woven hybrid cloth are for practical purposes eliminated. Resin impregnation can be achieved without special flexing or treatment and is more thoroughly accomplished.

The joint use of plied yarn for the warp and unplied yarn for the fill has a significant unexpected advantage. Unplied fill yarns are able to relax and conform more easily to the contour of the intersecting warp. This reduces the crimp angle that creates inherent stresses. During semi-curing and final curing, severe stresses are not retained so that the prepreg sheets and ultimate circuit panels demonstrate greater and acceptable dimensional stability. Internal compressive and tensile forces appear to be radically modified so that additional circuit layers are able to be included in a multilayer panel. The original dimensional change of substrates using cloth made entirely of plied yarns has been reduced significantly in panels made with the hybrid cloth of this invention.

Because of the attainment of thorough impregnation by the polymeric resin and the improved dimensional stability, yarns containing the usual count of 408 glass filaments each can be used for both the plied and unplied yarns while still maintaining readily acceptable circuit substrates. Because the yarns of original count sizes can be incorporated in the reinforcing cloth, the former requirement of extra layers of prepreg to achieve the required dielectric constant has been eliminated. Apparently, the reduction in crimp angle has provided a sufficiently stable product so that the hybrid cloth sheets can be used in numbers originally necessary for cloth made entirely with the unplied or twisted yarns.

Hybrid cloth has the advantage of reducing manufacturing cost of glass cloth substrates. The production of plied yarns is more expensive than unplied yarns. Since only half of the yarn necessary for the hybrid cloth is plied, a saving is available on the yarn cost. These savings further increase when yarns with a larger number of glass filaments are used which decreases the number of prepreg layers necessary to obtain a required dielectric constant or panel strength.

While the invention has been particularly shown and described with reference to a preferred embodiment thereof, it will be understood by those skilled in the art that various changes in form and details may be made therein without departing from the spirit and scope of the invention.

What is claimed is:

1. A substrate material comprising:

a glass woven fabric for printed circuit substrates, wherein the warp yarns are plied yarns and the fill yarns are unplied yarns.

2. A substrate material as set forth in claim 1 wherein said warp and fill yarns each contain the same number of filaments.

3. The substrate material as set forth in claim 1 wherein said material is impregnated with a polymeric resin.

4. The substrate material as set forth in claim 1 wherein said material is impregnated with a semi-cured polymeric resin.

5. The substrate material as set forth in claim 1 wherein said material is impregnated with a cured polymeric resin and has at least one electrically conductive circuit secured to a surface thereof.

6. A substrate material comprising:
   multiple layers of glass woven fabric for printed circuit substrates impregnated with a polymeric resin wherein the warp yarns are plied yarns and the fill yarns are unplied yarns in each of said layers.

* * * * *